United States Patent [19]
Farwell et al.

[11] Patent Number: 5,291,141
[45] Date of Patent: Mar. 1, 1994

[54] METHOD FOR CONTINUOUSLY MEASURING DELAY MARGINS IN DIGITAL SYSTEMS

[75] Inventors: William D. Farwell, Thousand Oaks; Alida G. Mascitelli, Northridge, both of Calif.

[73] Assignee: Hughes Aircraft Company, Los Angeles

[21] Appl. No.: 767,734

[22] Filed: Sep. 30, 1991

[51] Int. Cl.$^5$ .............................. H03K 5/26
[52] U.S. Cl. ..................... 324/617; 368/120; 328/129.1; 328/110; 328/109
[58] Field of Search ............. 368/120; 328/109, 110, 328/129.1; 324/617

[56] References Cited

U.S. PATENT DOCUMENTS

| | | | |
|---|---|---|---|
| 3,505,593 | 4/1970 | Gram | 324/617 |
| 3,634,869 | 1/1972 | Hsueh | 328/110 |
| 3,680,091 | 7/1972 | Rutherford | 328/110 |
| 3,735,271 | 5/1973 | Leibowitz | 328/110 |
| 3,758,856 | 9/1973 | Fromm | 328/110 |
| 4,146,835 | 3/1979 | Chnapko | 324/617 |
| 4,242,637 | 12/1980 | Ferguson | 328/110 |
| 4,392,105 | 7/1983 | McLeod | 324/617 |
| 4,703,251 | 10/1987 | Baumgartner | 324/617 |
| 4,712,061 | 12/1987 | Lach | 324/617 |
| 5,097,208 | 3/1992 | Chiang | 324/617 |

FOREIGN PATENT DOCUMENTS 1338241  11/1973  United Kingdom ............... 324/617

OTHER PUBLICATIONS

Scray: "Automatic Rise-Time Measurement"-IBM Bulletin Apr. 1960-p. 47.

Primary Examiner—Michael J. Tokar
Assistant Examiner—Jose M. Solis
Attorney, Agent, or Firm—L. A. Alkov; W. K. Denson-Low

[57] ABSTRACT

A digital data propagation delay margin monitoring circuit that includes (a) a digital data propagation unit having a send flip-flop, a combinatorial delay, and a receive flip-flop; and (b) a margin detection circuit having a test flip-flop that receives the same input as the receive flip-flop and is configured to have a set up time margin or a hold time margin that is less than the set up margin or hold time margin of the receive flip-flop by a predetermined amount, depending upon which margin is being monitored. The outputs of the receive flip-flop and the test flip-flop are compared by a comparison circuit which provides an indication of when the outputs of the receive flip-flop and the test flip-flop are different, which indicates that the monitored margin of the receive flip-flop has been reduced to a predetermined margin or less. For set up margin monitoring, the data propagation unit is the actual system path that is a worst case for set up, or a surrogate for such actual system path, and the test flip-flop is configured to have a reduced set up margin by a delay at its input or by an advanced clock signal. For hold margin monitoring, the data propagation unit is the actual system path that is a worst case for hold time, or a surrogate for such actual system path, and the test flip-flop is configured to have a reduced hold time margin by a delay clock signal.

3 Claims, 3 Drawing Sheets

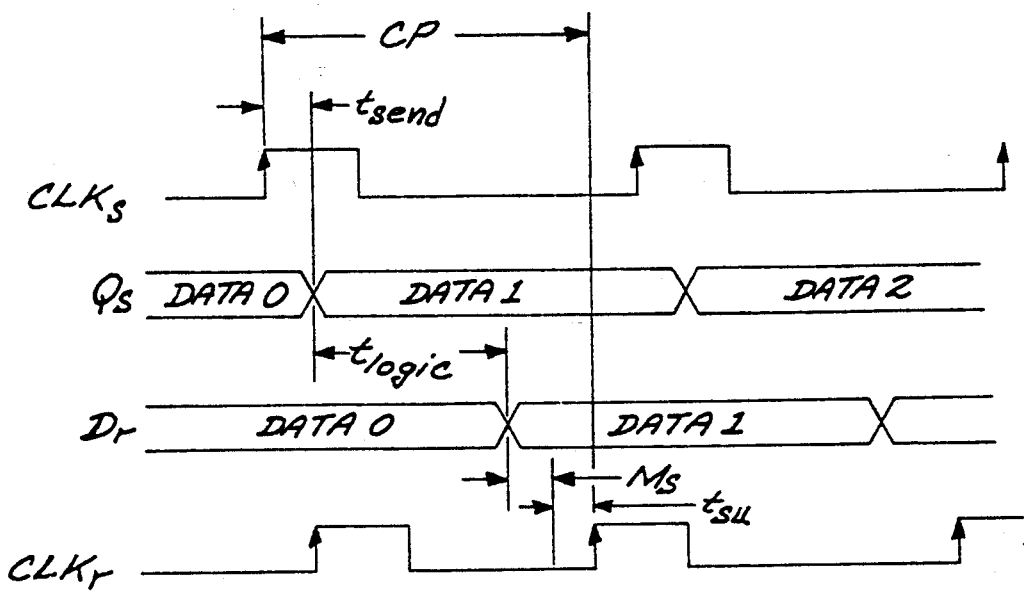
FIG. IA
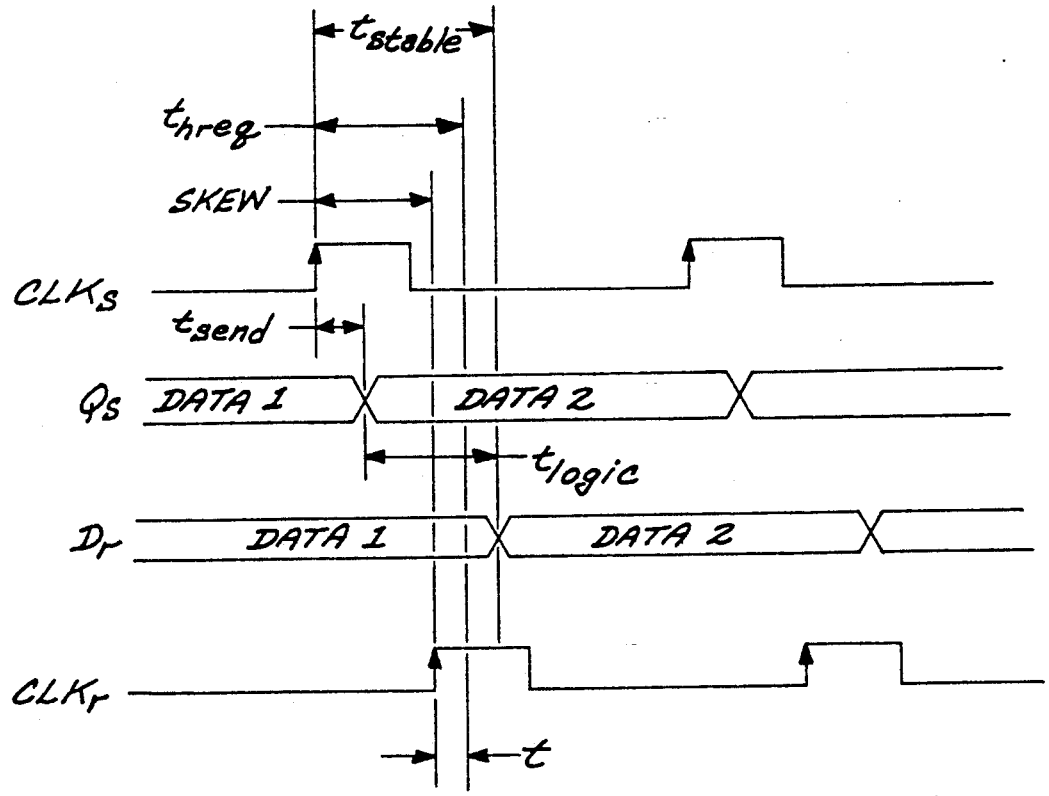
FIG. IB

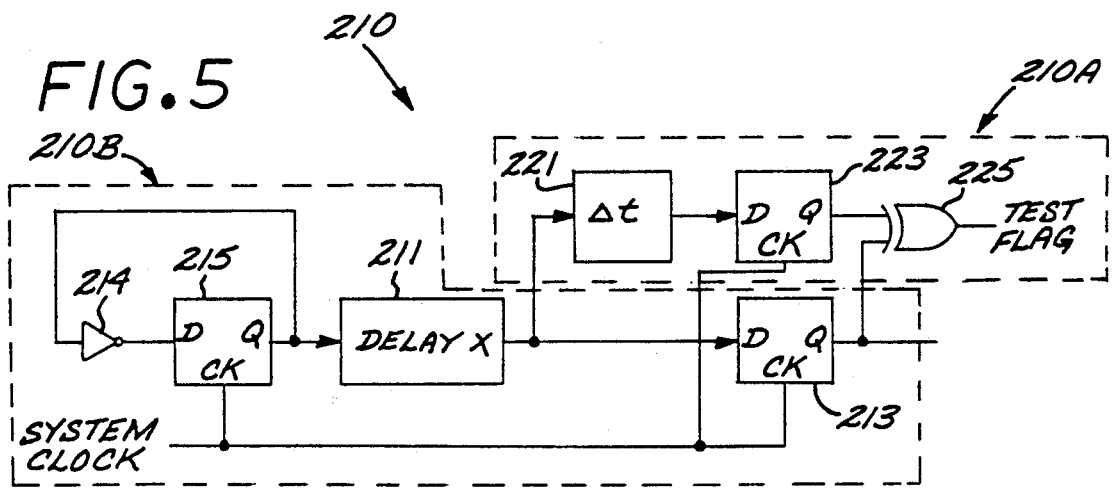
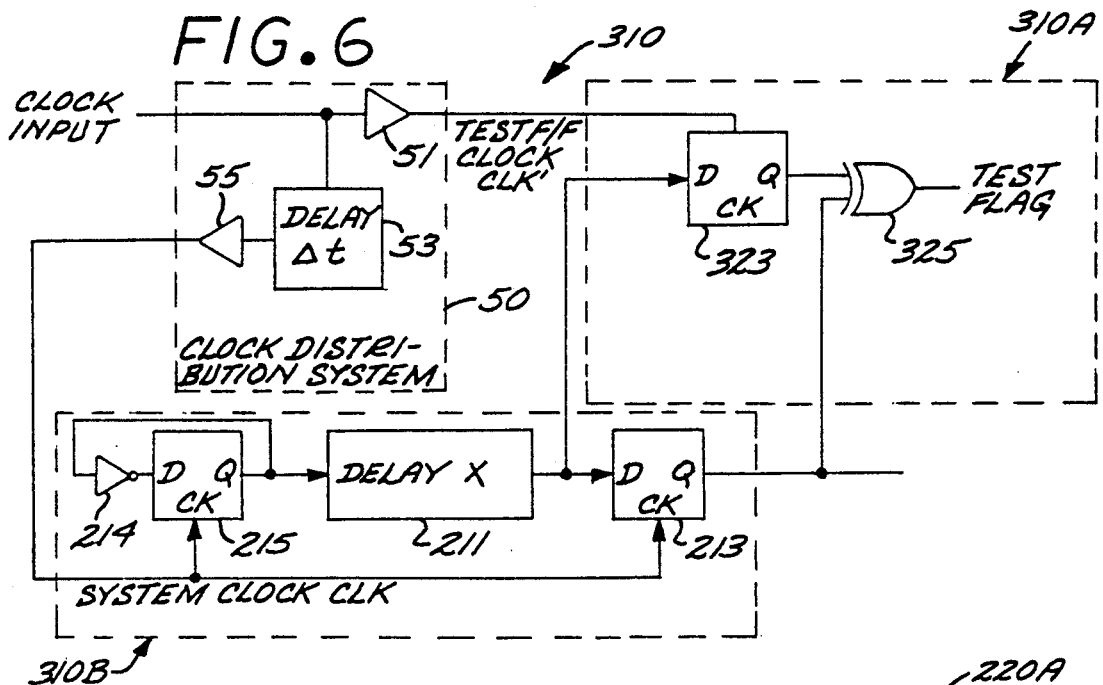
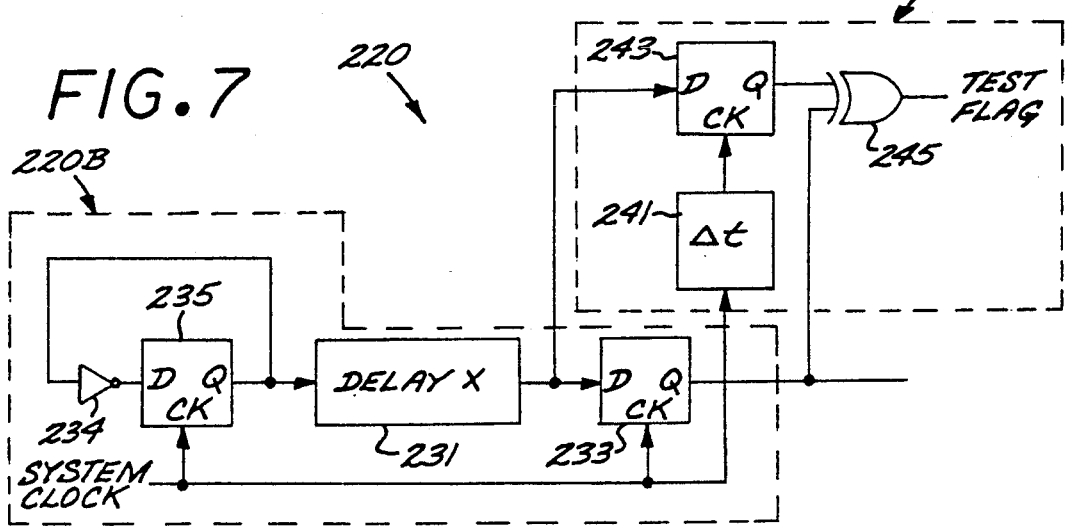

METHOD FOR CONTINUOUSLY MEASURING DELAY MARGINS IN DIGITAL SYSTEMS

BACKGROUND OF THE INVENTION

The disclosed invention is directed generally to synchronous digital circuit performance monitoring circuits, and more particularly to circuits for monitoring speed performance degradation in synchronous digital integrated circuits.

During the lifetime of a digital integrated circuit, its speed performance varies due to changing environmental conditions and aging. Speed of operation (i.e., clocking rate) of digital integrated circuits is typically based on worst case design parameters whereby a digital integrated circuit is clocked at a rate that will provide proper operation at the worst case condition. If a digital integrated circuit should operate outside its worst case design point, the system in which it operates will fail.

There are basically two types of speed failures: set-up failure which occurs when the input data to a flip-flop is not stable for a predetermined amount of time prior to the active clock transition, and hold time failure which occurs when the input data to a flip-flop is not stable for a predetermined amount of time after the active clock transition.

Presently, proper speed operation of synchronous digital integrated circuits can be verified by running tests. Set-up time margins can be evaluated by increasing clock frequency to set-up failure, and then comparing that frequency to the desired operating frequencies. However, set-up margin cannot be evaluated during actual in-system operation. Hold-time margin cannot be measured at all, since hold time margin is independent of clock frequency, and any test as to hold time can only provide a pass/fail indication.

It would be desirable to not only test for speed, but also to assure that finite speed margins exist in a design. Speed margins are an extra increment of speed performance in devices over what is used in system. For example, sufficient set up margin might be designed so that the digital integrated circuits could clock 10% faster than the system clock rate; sufficient hold time margin might be designed so that data would be held at flip-flop inputs 10% longer than required. The use of margins is sound design practice that assures reliable operation over the lifetime of a digital system.

SUMMARY OF THE INVENTION

It would therefore be an advantage to provide circuitry for monitoring set-up time and hold time margins of synchronous digital circuits.

Another advantage would be to provide circuitry for monitoring set-up time and hold time margins of synchronous digital circuits during in-system operation, so as to allow for continuous monitoring of system health.

A further advantage would be to provide circuitry for testing that designed set up and hold margins are actually achieved.

The foregoing and other advantages are provided by the invention a digital data propagation delay margin monitoring circuit that includes (a) a digital data propagation unit having a send flip-flop, a combinatorial delay, and a receive flip-flop; and (b) a margin detection circuit having a test flip-flop that receives the same input as the receive flip-flop and is configured to have a set up time margin or a hold time margin that is less than the set up margin or hold time margin of the receive flip-flop by a predetermined amount, depending upon which margin is being monitored. The outputs of the receive flip-flop and the test flip-flop are compared by a comparison circuit which provides an indication of when the outputs of the receive flip-flop and the test flip-flop are different, which indicates that the monitored margin of the receive flip-flop has been reduced to a predetermined margin or less. For set up margin monitoring, the data propagation unit is the actual system path that is a worst case for set up, or a surrogate for such actual system path, and the test flip-flop is configured to have a reduced set up margin by a delay at its input or by an advanced clock signal. For hold margin monitoring, the data propagation unit is the actual system path that is a worst case for hold time, or a surrogate for such actual system path, and the test flip-flop is configured to have a reduced hold time margin by a delay clock signal.

BRIEF DESCRIPTION OF THE DRAWINGS

The advantages and features of the disclosed invention will readily be appreciated by persons skilled in the art from the following detailed description when read in conjunction with the drawing wherein:

FIG. 1A is a timing diagram that illustrates set-up time parameters as to a sending flip-flop and a receiving flip-flop in a synchronous digital circuit.

FIG. 1B is a timing diagram that illustrates hold time parameters as to a sending flip-flop and a receiving flip-flop in a synchronous digital circuit.

FIG. 5 schematically depicts a continuous set-up time margin monitoring circuit for monitoring set-up time margin for surrogate path that is representative of an actual system path that is a worst case for set-up margin.

FIG. 6 schematically depicts a further continuous set-up time margin monitoring circuit for monitoring set-up time margin for surrogate path that is representative of an actual system, path that is a worst case for set-up margin.

FIG. 7 schematically depicts a hold time margin monitoring circuit for monitoring hold time margin for surrogate path that is representative of an actual system path that is a worst case for hold time margin.

DETAILED DESCRIPTION OF THE DISCLOSURE

Figure 2:
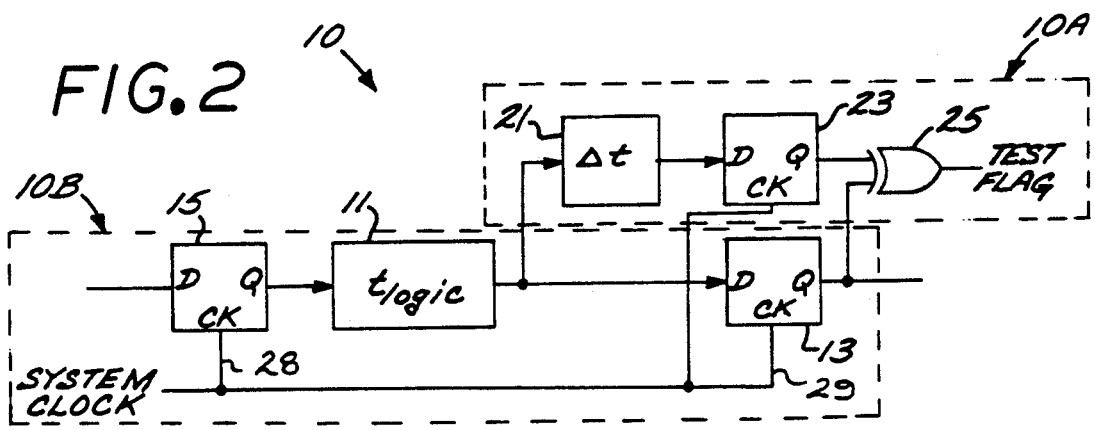
FIG. 2 schematically depicts a set-up time margin monitoring circuit for monitoring set-up time margin for an actual system path.

In the following detailed description and in the several figures of the drawing, like elements are identified with like reference numerals.

Figure 4:
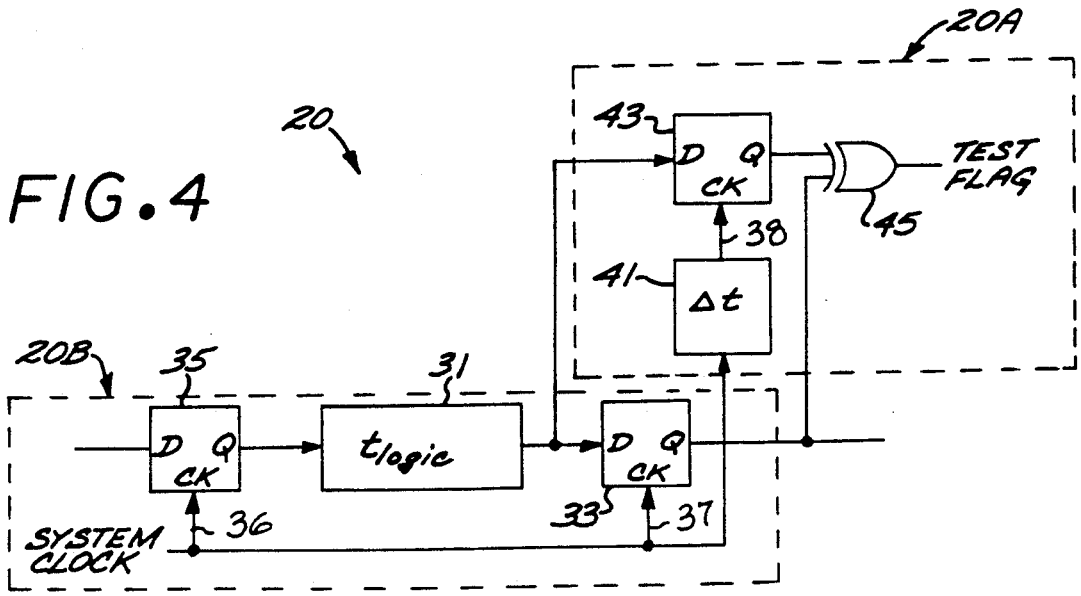
FIG. 4 schematically depicts a hold-time margin monitoring circuit for monitoring hold-time margin for an actual system path.

FIGS. 1A and 1B are timing diagrams that illustrate set-up time margin and hold time margin as to the basic unit of synchronous digital circuits as to which set-up time margin and hold time margin will be monitored in accordance with the invention. The basic unit includes a sending flip-flop whose output is $Q_s$, a combinatorial logic path that receives $Q_s$, and a receiving flip-flop whose input $D_r$ is provided by the output of the combinatorial logic path, and an intervening combinatorial logic path. While the elements of the basic unit are generally the same for set up margin and hold time margin considerations, the characteristics of the propagation delays in the basic propagation unit determine whether set-up time margin or hold time margin is the more important margin. For set-up time considerations, this basic unit is represented in FIG. 2 by the flip-flops 13, 15 and the combinatorial path 11. For hold time considerations, this basic unit is represented in FIG. 4 by the flip-flops 33, 35 and the combinatorial path 31.

Referring particularly to FIG. 1A, set-up time margin $M_s$ is based on two major time intervals: (1) the total required data propagation time $t_{set}$ pertinent to set up margin for the data propagation unit, and (2) the total available propagation time CP. The total required propagation time $t_{set}$ pertinent to set up margin is the sum of the sending flip-flop's clock-to-Q transition time $t_{send}$, the combinatorial logic delay $t_{logic}$, and the receiving flip flop's internal set-up time $t_{su}$ (the time for which the input data must be stable prior to the clock):

$$t_{set} = t_{send} + t_{logic} + t_{su} \quad \text{(Equation 1)}$$

The total available propagation time is the interval between (a) the active transition of the clock signal $CLK_s$ at the sending flip-flop and (b) the subsequent active transition of the clock signal $CLK_r$ at the receiving flip-flop. The available propagation time CP may be less than the system clock period due to clock skew wherein the clock signals at the sending and receiving flip-flops do not arrive at the same times. The set-up margin Ms for a propagation unit is therefore:

$$M_s = CP - t_{set} \quad \text{(Equation 2)}$$

For each propagation unit in a system the set-up time margin $M_s$ must be positive to assure proper operation; if it goes negative, the receiving flip-flop will register erroneous data. Also, the set up time margin $M_s$ can always be made more positive by increasing to total available propagation time CP. This may be accomplished by decreasing the combinatorial delay $t_{logic}$ during design, or by reducing the system operating clock frequency.

Referring now to FIG. 1B, hold-time margin for a basic data propagation unit is based on two major time intervals: (1) the total required time $t_{hreq}$ during which input data must be stable at the receiving flip-flop (taking into account that data can change state only once between clock transitions), and (2) the total time $t_{stable}$ during which the input data is stable. The total required time $t_{hreq}$ is the sum of the maximum possible clock SKEW and the required internal hold time $t_h$ of the receiving flip-flop (the time data must be stable after the clock edge):

$$t_{hreq} = SKEW + t_h \quad \text{(Equation 3)}$$

The total stable data time $t_{stable}$ is the sum of the sending flip-flop's minimum clock-to-Q transition time $t_{send}$ and the combinatorial logic delay $t_{logic}$:

$$t_{stable} = t_{send} + t_{logic} \quad \text{(Equation 4)}$$

The hold time margin $M_h$ is therefore:

$$M_h = t_{stable} - t_{hreq} \quad \text{(Equation 5)}$$

The hold time margin $M_h$ must be positive to assure proper operation; if it goes negative, the receiving flip-flop will register erroneous data. Also, the hold time margin $M_h$ for a data propagation unit can be made more positive only by increasing the combinatorial logic delay $t_{logic}$ with more delay during design, so as to increase the total time $t_{stable}$ during which input data is stable. The hold time margin $M_h$ is not affected by changing clock period.

Referring now to FIG. 2, set forth therein is a set up margin monitoring circuit 10 that includes a set up margin detection circuit 10A for detecting when the set up time margin of the receiving flip-flop of a monitored set up time worst case propagation unit 10B has decreased to a predetermined amount $\Delta t$ or less. The worst case propagation unit 10B includes a sending flip-flop 15 (with send clock signal on lead 28), a receiving flip-flop 13 (with receive clock signal on lead 29), and an intervening combinatorial logic path 11. The set up time worst case propagation unit 10B is conventionally determined during design and verified by simulation, and typically will be the one that has the longest propagation time $t_{set}$ as described above relative to Equation 1. The combinatorial logic of the set up worst case propagation unit 10B can comprise a plurality of combinatorial logic elements, and can be between separate integrated circuits.

The margin detection circuit 10A of the set up time monitoring circuit 10 includes a test flip-flop 23 that is co-located with the receiving flip-flop 13, and has substantially the same structure and set up time characteristics as the receiving flip-flop 13. The input to the test flip-flop 23 is a delayed version of the input to the receiving flip-flop 13 and is provided by a delay circuit 21 which provides a delay of $\Delta t$. The outputs of the test flip-flop 23 and the receiving flip-flop 13 are provided to an exclusive-OR gate 25 which provides a TEST FLAG output.

In operation, the outputs of the test flip-flop 23 and the receiving flip-flop 13 will be the same so long as the set up time margin for the receiving flip-flop 13 exceeds the delay $\Delta t$. By virtue of the delay circuit 21, the set up time margin provided for the test flip-flop 23 is less than the set up time margin provided for the receiving flip-flop 13, so that decreasing set up time margin for the receiving flip-flop 13 will be detected by set up failure of the test flip-flop 23 before the set up time margin at the receiving flip-flop 13 decreases to less than $\Delta t$.

Quantitatively, Equations 1 and 2 can be used to express the set-up margin $M_{sr}$ for the receiving flip-flop 13 and the set up margin $M_{st}$ for the test flip-flop 23:

$$M_{sr} = CP_r - (t_{send} + t_{logic} + t_{sur}) \quad \text{(Equation 6)}$$

$$M_{st} = CP_t - (t_{send} + t_{logic} + t_{sut} + \Delta t) \quad \text{(Equation 7)}$$

Where $CP_r$ and $CP_t$ are the available clock periods at the receiving and test flip-flops, respectively; and $t_{sur}$ and $t_{sut}$ are the internal set-up times of the receiving and test flip-flops, respectively.

Since the receiving and test flip-flops are physically co-located on the integrated circuit and are built the same way, their internal set up times are equal, $t_{sur} = t_{sut}$. Since they connect to the clock distribution at the same point the available clock periods are the same, $CP_r = CP_t$. With these equalities satisfied, Equations 6 and 7 can be reduced to:

$$M_{sr} = M_{st} + \Delta t \qquad \text{(Equation 8)}$$

Thus, when the set up margin for the test flip-flop 23 has decreased to zero, which causes the TEST FLAG signal to be active, the remaining set up margin $M_{sr}$ for the receiving flip-flop is $\Delta t$.

Figure 3:
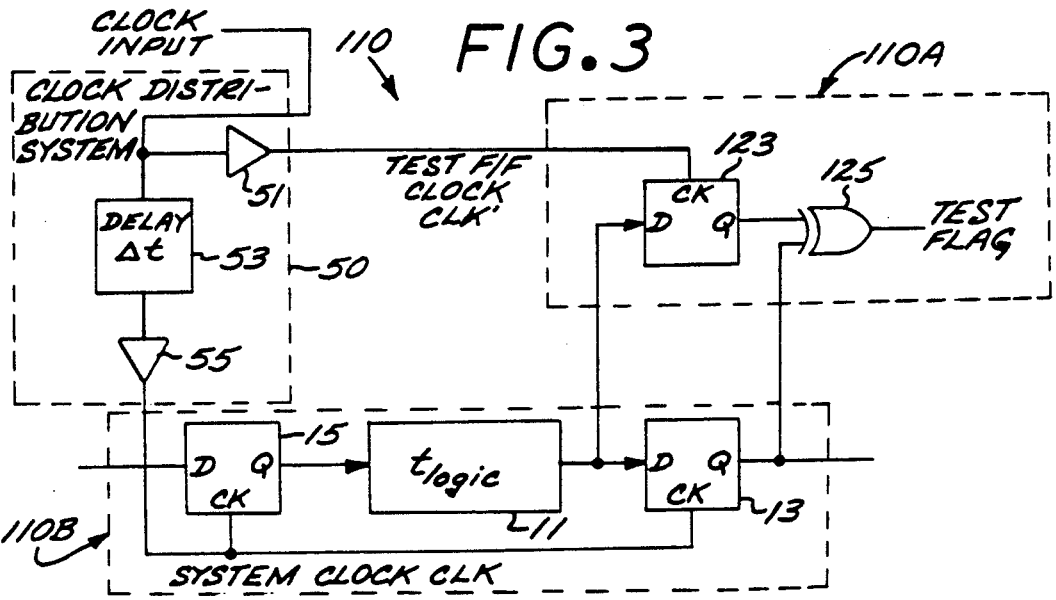
FIG. 3 schematically depicts a further example of a set-up time margin monitoring circuit for monitoring set-up time margin for an actual system path.

Referring now to FIG. 3, set forth therein is an alternative set up margin monitoring circuit 110 that includes a set up margin detection circuit 110A for detecting when the set up time margin for the receiving flip-flop of a monitored set up time worst case propagation unit 110B has decreased to a predetermined amount $\Delta t$ or less. The worst case propagation unit 110A is substantially the same as the worst case propagation unit 10B of the set up monitoring circuit of FIG. 2. The set up margin detection circuit 110A includes a test flip-flop 123 that is co-located with the receiving flip-flop 13, and has substantially the same structure and hold time characteristics as the receiving flip-flop 13. The test flip-flop 123 receives the same input as the receiving flip-flop 13, but is clocked with a test flip-flop clock CLK' that is advanced relative to the system clock CLK provided to the receiving flip-flop 13. The clock signals CLK and CLK' can be provided by a clock distribution system 50 which includes a clock buffer 51 that is responsive to a clock input and provides the test flip-flop clock signal CLK. A delay circuit 53 responsive to the clock input and a clock buffer 55 responsive to the output of the delay circuit provide the system clock CLK which is delayed relative to the test flip-flop clock CLK' by the desired margin $\Delta t$. Thus, the set up time provided for the test flip-flop 123 is less than the set up time provided for the receiving flip-flop 13. The outputs of the receiving flip-flop 13 and the test flip-flop 123 are provided as inputs to an exclusive-OR gate 125 that provides a TEST FLAG output. The operation of the set up time monitoring circuit 110 of FIG. 3 is similar to the operation described above for the set up time monitoring circuit 10 of FIG. 2. When a transition occurs at the output of the combinatorial logic delay 11, the outputs of the test flip-flop 123 and the receiving flip-flop 13 will be the same so long as the set up margin at the test flip-flop 123 remains greater than zero. By virtue of the advanced clock CLK' provided to the test flip-flop 123, the set up time margin provided for the test flip-flop 123 is less than the set up time margin provided for the receiving flip-flop 13, so that decreasing set up time margin for the receiving flip-flop 13 will be detected by set up failure of the test flip-flop 123 before the set up time margin at the receiving flip-flop 13 decreases to less than the desired margin $\Delta t$.

Referring now to FIG. 4, set forth therein is a data hold time margin monitoring circuit 20 that includes a hold margin detection circuit 20A for detecting when the hold time margin for the receiving flip-flop of a hold time worst case digital propagation unit 20B has decreased to $\Delta t$. The hold time worst case digital propagation unit 20B includes a sending flip-flop 35 (with send clock signal on lead 36), a combinatorial logic path 31 that receives the output of the sending flip-flop 35, and the receiving flip-flop 33 (with receive clock signal on lead 37) that receives the output of the combinatorial logic path 31. The combinatorial path 31 can comprise a plurality of combinatorial logic elements, and can be between separate integrated circuits. The hold time worst case propagation unit 20B is conventionally determined during design and verified by simulation, and will typically have a stable data time $t_{stable}$ (Equation 4) that is only slightly longer than the total time $t_{hreq}$ (Equation 3) during which the input data must be stable to avoid hold time failure (e.g., the worst case path is that which has the minimum value of hold time margin $M_h$)

The hold time margin detection circuit 20A includes a test flip-flop 43 (with test clock signal on lead 38) that is co-located with the receiving flip-flop 33 and has substantially the same structure and hold time characteristics as the receiving flip-flop 33. The input to the test flip-flop 43 is the input to the receiving flip-flop 33. The clock provided to the test flip-flop 43 is a delayed version of the clock signal provided to the receiving flip-flop 33, and is provided by a delay circuit 41 that provides a delay of $\Delta t$. The outputs of the test flip-flop 43 and the receiving flip-flop 33 are provided to an exclusive-OR gate 45 which provides a TEST FLAG output.

In operation, when a transition occurs at the output of the combinatorial delay path 41, the outputs of the test flip-flop 43 and the receiving flip-flop 33 will be the same so long as the hold time margin for the receiving flip-flop 33 is greater than $\Delta t$. By virtue of the delay circuit 41, the hold time margin provided for the test flip-flop 43 is less than the hold time margin provided for the receiving flip-flop 33, so that decreasing hold time margin for the receiving flip-flop 33 will be detected by hold time failure of the test flip-flop 43 when the hold time margin at the receiving flip-flop 313 has decreased to $\Delta t$.

Quantitatively, Equations 3, 4, and 5 can be used to express the hold margin $M_{hr}$ for the receiving flip-flop and the hold margin $M_{ht}$ for the test flip-flop:

$$M_{hr} = (t_{send} + t_{logic}) - (t_{hr} + SKEW_r) \qquad \text{(Equation 9)}$$

$$M_{ht} = (t_{send} + t_{logic}) - (t_{ht} + SKEW_t \Delta t) \qquad \text{(Equation 10)}$$

where $t_{hr}$ and $t_{ht}$ are the internal hold times of the receiving and test flip-flops, respectively; and $SKEW_r$ and $SKEW_t$ are the clock skews at the receiving and test flip-flops, respectively, relative to clock received by the sending flip-flop.

Since the receiving and test flip-flops are physically co-located on the integrated and built the same way, their internal hold times are equal, $t_{hr} = t_{ht}$. Since they are connected to the clock distribution at the same point their clock skews are equal, $SKEW_r = SKEW_t$. With these equalities satisfied, Equations 9 and 10 reduce to:

$$M_{hr} = M_{ht} + \Delta t \qquad \text{(Equation 11)}$$

Thus, when the hold time margin of the test flip-flop decreases to zero, at which time the TEST FLAG signal will be activated, the remaining actual hold time margin for the receiving flip-flop is $\Delta t$.

A consideration with the set up monitoring circuits of FIGS. 2 and 3, and the hold monitoring circuit of FIG. 4 is that they utilize actual system data propagation paths and therefore monitoring occurs only when there is a change of state at the input of the receiving flip-flop. Depending upon the particular system, change of state might not occur with sufficient frequency to allow for effective real-time monitoring. FIGS. 5 through 7 illustrate continuous set up margin monitoring circuits (FIGS. 5 and 6) and a continuous hold time monitoring circuit (FIG. 6) in accordance with the invention.

Referring in particular to FIG. 5, schematically depicted therein is a continuous set up time margin monitoring circuit 210 which is structurally similar to the circuit of FIG. 2. The margin monitoring circuit 210 includes a set up margin detection circuit 210A for detecting when the set up margin for a surrogate set up margin worst case propagation unit has decreased to a predetermined amount Δt or less. The surrogate propagation unit 210B is a surrogate for the actual system path that is most likely to have a set-up failure, and thereby represents the system data propagation path which is the worst case for set up margin. The surrogate propagation unit includes a monitor send flip-flop 215 whose input is provided by an inverter 214 connected between the output and input of the monitor send flip-flop 215. The output of the monitor send flip-flop 215 is further provided to a delay circuit 211 that provides a delay of X, and which provides the input for a monitor receive flip-flop 213.

The margin detect circuit 210 of the continuous set up margin monitoring circuit of FIG. 5 further includes a test flip-flop 223 that is co-located with the monitor receiving flip-flop 213, and has substantially the same structure and set up time characteristics as the monitor receiving flip-flop 213. The input to the test flip-flop 223 is a delayed version of the input to the monitor receiving flip-flop 213, and is provided by a delay circuit 221 which provides a delay of Δt. The outputs of the test flip-flop 223 and the monitor receiving flip-flop 213 are provided to an exclusive-OR gate 225 which provides a TEST FLAG output. By virtue of the feedback inverter 214, the signals provided to the monitor receive flip-flop 213 and the test flip-flop 223 change state on every clock.

Except for the input to the monitor send flip-flop 215, the circuit of FIG. 5 is topologically the same as the circuit of FIG. 2, and the operation and analysis are substantially the same.

The delay X of the delay circuit 211 is selected such that the set up margin for the surrogate propagation unit 210B is substantially equal to the set up margin for the worst case system propagation path. Thus, the delay X can be determined by expressing the set up margin $M_s$, for the surrogate propagation unit and the set up margin $M_s$ for the worst case system path pursuant to Equations 1 and 2:

$$M_{s'} = CP - (t_{send'} + X + t_{sur'}) \qquad \text{(Equation 12)}$$

$$M_s = CP - (t_{send} + t_{logic} + t_{sur}) \qquad \text{(Equation 13)}$$

Equating the right sides of the foregoing equations provides the following from which the delay X can be determined:

$$CP - (t_{send'} + X + t_{sur'}) = CP - (t_{send} + t_{logic} + t_{sur}) \qquad \text{(Equation 14)}$$

Since the set up margin of the surrogate propagation unit is substantially equal to the set up margin of the represented actual system path, substitution of the surrogate propagation unit set up margin $M_{s'}$ in Equation 8 indicates that when the set up margin for the test flip-flop 223 has decreased to zero, which causes the TEST FLAG signal to be active, the remaining set up margin $M_{sr}$ for the represented system worst case path is Δt.

Referring now to FIG. 6, schematically depicted therein is a continuous set up time margin monitoring circuit 310 which is structurally similar to the circuit of FIG. 3. The margin monitoring circuit 310 includes a set up margin detection circuit 310A for detecting when the set up margin for a surrogate set up margin worst case propagation unit 310B has decreased to a predetermined amount Δt or less. The surrogate worst case propagation unit 310A is substantially the same as the surrogate worst case propagation unit 210B of the continuous set up margin monitoring circuit of FIG. 5. The set up margin detection circuit 310A includes a test flip-flop 323 that is co-located with the monitor receiving flip-flop 213, and has substantially the same structure and hold time characteristics as the monitor receiving flip-flop 213. The test flip-flop 323 receives the same input as the monitor receiving flip-flop 213, but is clocked with a test flip-flop clock CLK' that is advanced by Δt relative to the system clock CLK provided to the monitor receiving flip-flop 213. The clock signals CLK and CLK' can be provided by a clock distribution system 50 as in the set up margin monitor circuit 110 of FIG. 3. Thus, the set up time provided for the test flip-flop 323 is less than the set up time provided for the monitor receiving flip-flop 213. The outputs of the monitor receiving flip-flop 213 and the test flip-flop 323 are provided as inputs to an exclusive-OR gate 325 that provides a TEST FLAG output. The operation of the continuous set up time monitoring circuit 310 of FIG. 6 is similar to the operation described above for the continuous set up time monitoring circuit 210 of FIG. 5. When a transition occurs at the output of the delay circuit 211, the outputs of the test flip-flop 323 and the monitor receiving flip-flop 213 will be the same so long as the set up margin at the test flip-flop 323 remains greater than zero. By virtue of the advanced clock CLK' provided to the test flip-flop 323, the set up time margin provided for the test flip-flop 323 is less than the set up time margin provided for the monitor receiving flip-flop 213, so that decreasing set up time margin for the monitor receiving flip-flop 213 will be detected by set up failure of the test flip-flop 323 before the set up time margin at the monitor receiving flip-flop 213 decreases to less than the desired margin Δt.

Referring now to FIG. 7, schematically depicted therein is a continuous hold time margin monitoring circuit 220 which is structurally similar to the hold margin monitoring circuit of FIG. 4. The hold time monitoring circuit 220 includes a hold margin detection circuit 220A for detecting when the hold time margin for a surrogate hold time worst case digital propagation unit 220B has decreased to Δt. The surrogate data propagation unit 220B is a surrogate for the actual system path that is most likely to have a hold time failure, and thereby represents the system data propagation path that is the worst case for hold time margin.

The surrogate worst case data propagation unit 220B includes a monitor send flip-flop 235 whose input is provided by an inverter 234 connected between the output and input of the monitor send flip-flop 235. The output of the monitor send flip-flop is further provided to a delay circuit 231 that provides a delay of X, and which provides the input for a monitor receive flip-flop 233.

The hold margin detection circuit 220A of the hold time margin monitoring circuit 220 includes a test flip-flop 243 that is co-located with the monitor receiving flip-flop 233 and has substantially the same structure and hold time characteristics as the monitor receiving flip-flop 233. The input to the test flip-flop 243 is the input to the receiving flip-flop 233. The clock provided to the test flip-flop 243 is a delayed version of the clock signal provided to the monitor receiving flip-flop 233, and is provided by a delay circuit 241 that provides a delay of Δt. The outputs of the test flip-flop 243 and the monitor receiving flip-flop 233 are provided to an exclusive-OR gate 245 which provides a TEST FLAG output. By virtue of the feedback inverter 234, the signals provided to the monitor receive flip-flop 233 and the test flip-flop 243 change state on every clock.

Except for the input to the monitor send flip-flop 235, the circuit of FIG. 7 is topologically the same as the circuit of FIG. 4, and the operation and analysis are substantially the same.

The delay X of the delay circuit 231 is selected such that the hold time margin for the surrogate propagation unit 220B is substantially equal to the hold margin for the worst case system propagation path. Thus, the delay X can be determined by expressing the hold margin $M_{hr'}$ for the surrogate propagation unit and the hold margin $M_{hr}$ for the worst case system path pursuant to Equations 4 and 5:

$$M_{hr'} = (t_{send'} + X) - t_{hreq'} \qquad \text{(Equation 15)}$$

$$M_{hr} = (t_{send} + t_{logic}) - t_{hreq} \qquad \text{(Equation 16)}$$

Equating the right sides of the foregoing equations provides the following from which the delay X can be determined:

$$(t_{send'} + X) - t_{hreq'} = (t_{send} + t_{logic}) - t_{hreq} \qquad \text{(Equation 17)}$$

Since the hold time margin of the surrogate propagation unit 220B is substantially equal to the hold time margin of the represented actual system path, substitution of the surrogate path hold time margin $M_{hr}$ in Equation 11 indicates that when the hold time margin for the test flip-flop 243 has decreased to zero, which causes the TEST FLAG signal to be active, the remaining hold margin $M_{hr}$ for the represented hold time worst case path is Δt.

The foregoing has been a disclosure of circuitry for direct in system monitoring set up time and hold time margins in integrated circuits while the monitored circuits which advantageously provides for increased reliability by indicating the possibility of impending delay failures, which allows for remedial action before actual failures occur. Direct monitoring of set up time margin in accordance with the invention provides a adaptive performance digital systems wherein clock rates can be maintained at a safe upper limit, in contrast to present systems wherein clock rates are typically set at the slowest rate for the worst case operating conditions (such as increased temperatures) which rarely occur. Direct monitoring of hold time margin in accordance with the invention allows for determination of actual hold time margin, in contrast to prior art pass/fail testing. The invention also provides improved means for testing that designed set up and hold margins are actually achieved.

Although the foregoing has been a description and illustration of specific embodiments of the invention, various modifications and changes thereto can be made by persons skilled in the art without departing from the scope and spirit of the invention as defined by the following claims.

What is claimed is:

1. A set up time margin monitoring circuit for monitoring the set up margin of a monitored circuit that includes a sending flip-flop (15) that is clocked by a send clock signal (28) and a receiving flip-flop (13) that is clocked by a receive clock signal (29), and a combinatorial delay path (11) between the output of the sending flip-flop (28) and the input of the receiving flip-flop (29), the set up time margin monitoring circuit comprising:

test flip-flop (23) clocked by a test clock for receiving the same data as provided to the receiving flip-flop (13);

margin defining means for providing a set up margin for the test flip-flop (23) that is less than the set up margin for the receiving flip-flop (29) of the monitored circuit; and comparison means for comparing the output of the receiving flip-flop (13) and said test flip-flop (29) to provide an output indicative of whether set up failure has occurred at said test flip-flop (23).

2. The set up time monitoring circuit of claim 1 wherein said test flip-flop (29) is clocked with the clock signal provided to the monitor receiving flip-flop (13), and wherein said set up margin defining means includes a delay circuit interposed between the output of the combinatorial delay and the input of said test flip-flop (23).

3. The set up time monitoring circuit of claim 1 wherein the input of said test flip-flop receives the output of the combinatorial delay, and wherein said set up margin defining means includes means for delaying the receive clock relative to said test clock.

* * * * *